United States Patent
Chung et al.

(10) Patent No.: US 7,981,705 B2
(45) Date of Patent: Jul. 19, 2011

(54) METHOD OF MANUFACTURING A VERTICAL TYPE LIGHT-EMITTING DIODE

(75) Inventors: Wei-Jung Chung, Pingtung (TW); Shih-Hung Lee, Caotun Township, Nantou County (TW); Cheng-Hsien Li, Kaohsiung (TW); Wen-Hsien Lin, Anding Township, Tainan County (TW); Nien-Tze Yeh, Zhongli (TW)

(73) Assignee: Tekcore Co., Ltd., Nantou (CN)

( * ) Notice: Subject to any disclaimer, the term of this patent is extended or adjusted under 35 U.S.C. 154(b) by 0 days.

(21) Appl. No.: 12/846,999

(22) Filed: Jul. 30, 2010

(65) Prior Publication Data

US 2011/0097831 A1    Apr. 28, 2011

(30) Foreign Application Priority Data

Jul. 31, 2009   (TW) ................................ 98125991 A

(51) Int. Cl.
  *H01L 21/00*   (2006.01)
  *H01L 27/148*  (2006.01)

(52) U.S. Cl. ................ 438/22; 438/24; 438/42; 438/44; 257/220; 257/290; 257/E33.001; 257/E33.006; 313/504; 313/506; 428/690; 428/917

(58) Field of Classification Search .................... 438/22, 438/24, 42, 44; 257/220, 290, 414, E33.001, 257/E33.006; 313/504, 506; 428/690, 917
See application file for complete search history.

(56) References Cited

U.S. PATENT DOCUMENTS
2006/0225644 A1 * 10/2006 Lee et al. ........................ 117/89
* cited by examiner

*Primary Examiner* — Hsien-ming Lee
(74) *Attorney, Agent, or Firm* — David I. Roche; Baker & McKenzie LLP

(57) ABSTRACT

In a method of manufacturing a vertical type light-emitting diode, a multilayered structure of group III nitride semiconductor compounds is epitaxy deposited on an irregular surface of a substrate. The substrate is then removed to expose an irregular surface of the multilayered structure corresponding to the irregular surface of the substrate. A portion of the exposed irregular surface of the multilayered structure is then etched for forming an electrode contact surface on which an electrode layer is subsequently formed. With this method, no specific planarized region is required on the irregular surface of the substrate. As a result, planarization treatment of the substrate is not necessary. The same substrate with the irregular surface can be reused for fabricating vertical and horizontal light-emitting diodes.

8 Claims, 3 Drawing Sheets

METHOD OF MANUFACTURING A VERTICAL TYPE LIGHT-EMITTING DIODE

CROSS-REFERENCE TO RELATED APPLICATION

This application claims priority to Taiwan Patent Application No. 98125991, filed on Jul. 31, 2009.

BACKGROUND OF THE INVENTION

1. Field of the Invention

The present invention relates to a method of manufacturing a light-emitting diode and more particularly to a method of manufacturing group III nitride semiconductor vertical type light-emitting diodes.

2. Description of the Related Art

Light-emitting diodes (LEDs) are widely used in many applications, such as exterior illumination lamps, interior lights, electric appliances requiring displays such as notebook computers, cellular phones, etc. Many direct-gap semiconductors have been used for fabricating LEDs. For example, gallium nitride (GaN) based LEDs are extensively used for emitting blue light because of its wide band gap (about 3.48 eV), higher light emission efficiency, high mobility, stable chemical properties and heat stability. In the current trend, a particular focus is also made on the development of LEDs, especially vertical light-emitting diodes (VLEDs), that have higher emission efficiency, higher yield and low fabrication cost.

Various approaches have been proposed for improving light emission of VLEDs. For example, one known approach consists of forming regular or irregular coarse patterns on the surface of various gallium nitride layers in the VLED to increase effective surface area of light emission. To this end, the gallium nitride layer structure of the VLED is usually formed on a surface of a sapphire substrate that is provided with regular or irregular uneven patterns. Then, the sapphire substrate is removed to obtain a multilayered structure with a coarse patterned surface. Two electrode structures are subsequently formed on two opposite sides of the multilayered structure, one on the coarse patterned surface, the other on another surface of the multilayered structure opposite the coarse patterned surface.

The regular or irregular uneven surface pattern can increase the effective emission area of the VLED, and reduce lattice mismatch for improving the crystalline quality of the epitaxy layer formed on the substrate. However, the uneven contact surface between the electrode and the multilayered epitaxy structure may result in non-uniform voltage distribution and higher resistance. One solution to this issue is to specifically leave an even and planarized area on the coarse surface of the sapphire substrate, such that the multilayered structure formed subsequently has a corresponding even contact surface for forming the electrode. This approach requires the application of a surface treatment on the sapphire substrate, which increases the cost of the substrate. In addition, while VLED structures require to form electrodes on opposite surfaces of the active multilayered structure, other LED structures (e.g., "horizontal" LED) may have all the electrodes formed on a same side of the multilayered structure and do not need such specifically-treated substrate.

Therefore, there is a need for a manufacturing method that can address the foregoing issues and fabricate a VLED in a more cost-effective manner.

SUMMARY

The present invention provides a method of manufacturing a vertical type light-emitting diode. In some embodiment, the method comprises providing a first substrate having an irregular surface, forming a multilayered epitaxy structure of group III nitride semiconductor compound layers on the irregular surface, wherein the multilayered epitaxy structure has a first surface in contact with the irregular surface and a second surface opposite the first surface, placing a second substrate on the second surface, removing the first substrate to expose the first surface of the multilayered epitaxy structure, etching a portion of the first surface to form an electrode contact surface, and forming an electrode on the electrode contact surface.

At least one advantage of the method described herein is the ability to define the electrode contact surface directly on the multilayered epitaxy structure. Therefore, no planarized area for the electrode contact is required on the irregular surface of the substrate. Accordingly, the same substrate can be used for different LED structures (e.g., VLED or horizontal LED), and the cost of the substrate can also be reduced.

DETAILED DESCRIPTION OF THE EMBODIMENTS

The present application describes a method of manufacturing a vertical type light-emitting diode, in which a multilayered structure of group III nitride semiconductor compounds is epitaxy deposited on an irregular surface of a substrate. The substrate is then removed to expose an irregular surface of the multilayered structure corresponding to the irregular surface of the substrate. A portion of the exposed irregular surface of the multilayered structure is then etched for forming an electrode contact surface on which an electrode layer is subsequently formed. With this method, no specific planarized region is required on the irregular surface of the substrate. As a result, planarization treatment of the substrate is not necessary. The same substrate with the irregular surface can be reused for fabricating vertical and horizontal light-emitting diodes.

For clarity, the term "group III-nitride compounds" as used herein refers to any compounds containing nitrogen (N) and chemical elements classified in the group III of the periodic table of chemical elements (such as aluminum (Al), gallium (Ga), indium (In)), and ternary compounds thereof (such as AlGaN, AlInGaN). Moreover, it is worth noting that the multi-layer structure of group III nitride semiconductor compounds can include any suitable layer structures for VLED. In one embodiment, this stack of layers can include, without limitation, a light-emitting layer sandwiched between a n-type semiconductor layer and a p-type semiconductor layer.

Figure 1:
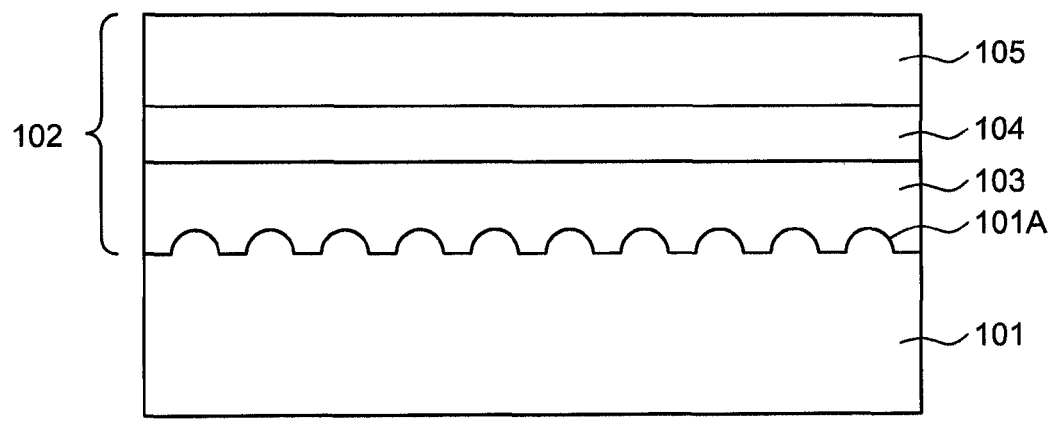
FIG. 1 is a schematic view illustrating a multilayered epitaxy structure formed on a substrate.

FIGS. 1 through 6 are schematic views illustrating method steps implemented for manufacturing a vertical type light-emitting diode. Referring to FIG. 1, a substrate 101 is first placed in an epitaxy deposition system. The substrate 101 can comprise a sapphire substrate, a silicon (Si) substrate, a silicon carbide (SiC) substrate, or any other suitable materials. The upper surface of the substrate 101 is an irregular surface 101A. The irregular surface 101A can have any regular or irregular uneven patterns. The irregular surface 101A is used to promote epitaxy growth of group III-nitride semiconductor compounds thereon. A multilayered epitaxy structure 102 composed of group III-nitride semiconductor compounds is formed on the irregular surface 101A of the substrate 101 by epitaxy deposition (such as metal-organic chemical vapor deposition). In one embodiment, the epitaxy structure 102 can include a n-type GaN layer 103, a light-emitting layer 104 composed of multiple quantum well (MQW), and a p-type GaN layer 105. Depending on the design requirements, the multilayered epitaxy structure 102 can also comprises additional material layer(s).

Figure 2:
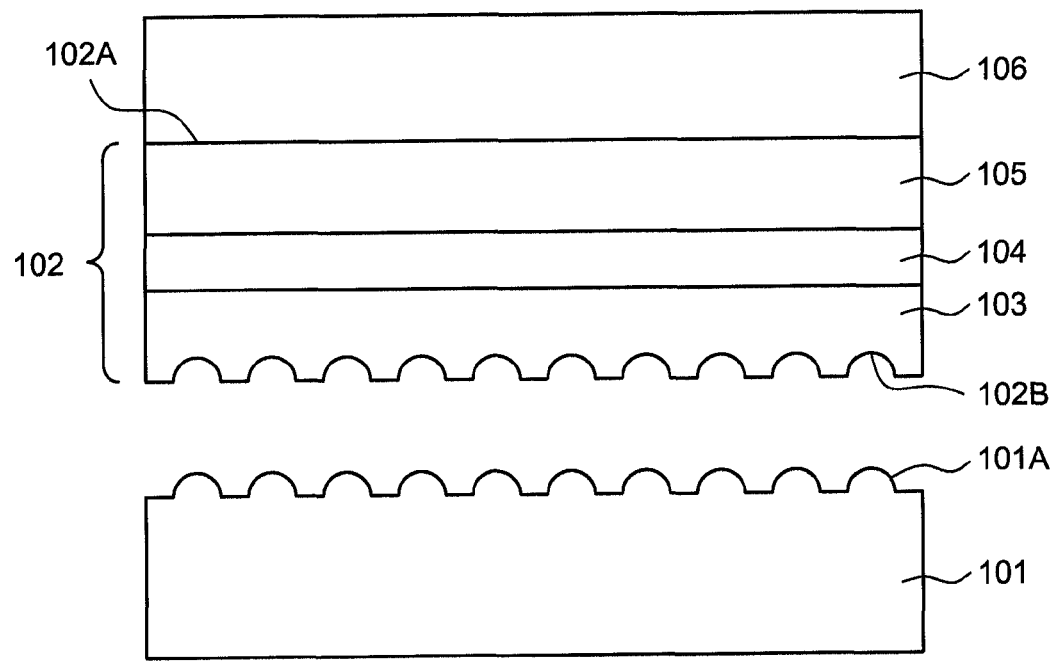
FIG. 2 is a schematic view illustrating the removal the substrate.

Next referring to FIG. 2, the substrate 101 with the multilayered epitaxy structure 102 thereon is removed from the epitaxy deposition system, and a conducting substrate 106 is placed on the surface 102A of the multilayered epitaxy structure 102 opposite to the side of the substrate 101. According to one embodiment, the conducting substrate 106 can comprise a metallic substrate, a semiconductor substrate, or similar conductive materials. After the conducting substrate 106 is put in place on the top of the multilayered epitaxy structure 102, the substrate 101 can be removed by laser lift-off for exposing the surface 102B of the multilayered epitaxy structure 102. Because the surface 102B was in contact with the irregular surface 101A of the substrate 101 during epitaxy deposition, the surface 102B also exhibits corresponding irregular patterns.

Figure 3:
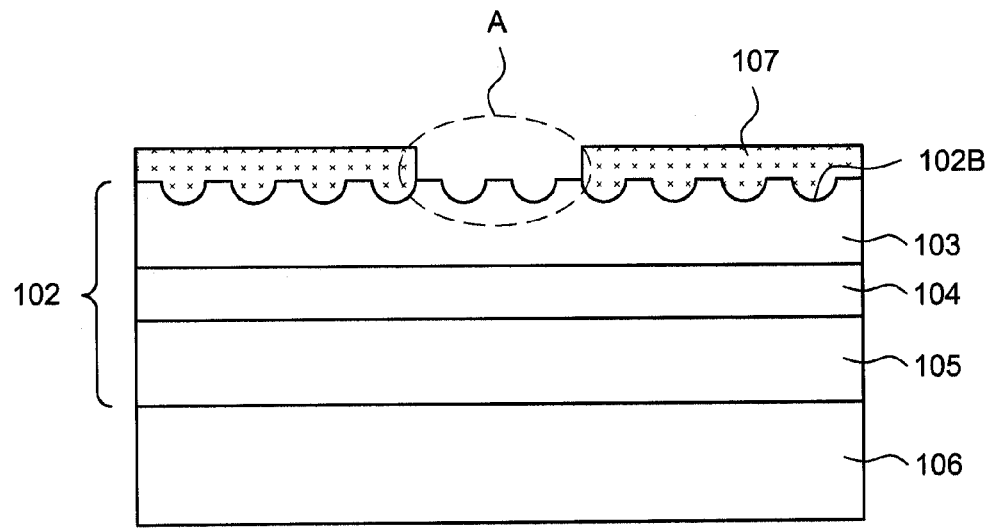
FIGS. 3 through 5 are schematic views illustrating method steps for forming an electrode contact area on the multilayered epitaxy structure.

Next referring to FIG. 3, a photoresist layer 107 is laid on the surface 102B of the multilayered epitaxy structure 102, and a region A corresponding to an electrode of the VLED is defined by exposure and developing processes. A portion of the surface 102B of the multilayered epitaxy structure 102 is exposed via the opening of the region A in the photoresist layer 107.

Figure 4:
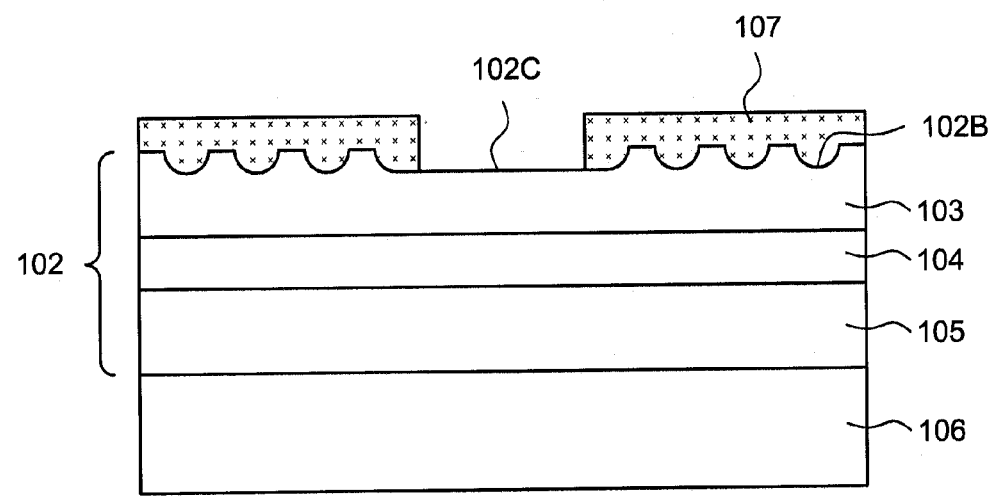
Figure 5:
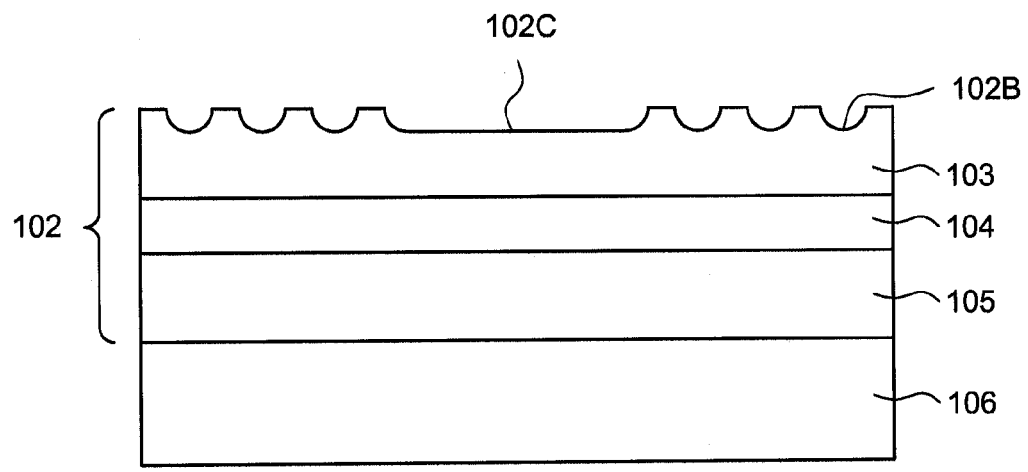

Referring to FIG. 4, the portion of the surface 102B exposed via the region A is etched by using the photoresist layer 107 as mask to planarize it and form an electrode contact surface 102C. The photoresist 107 can be then removed, as shown in FIG. 5.

Figure 6:
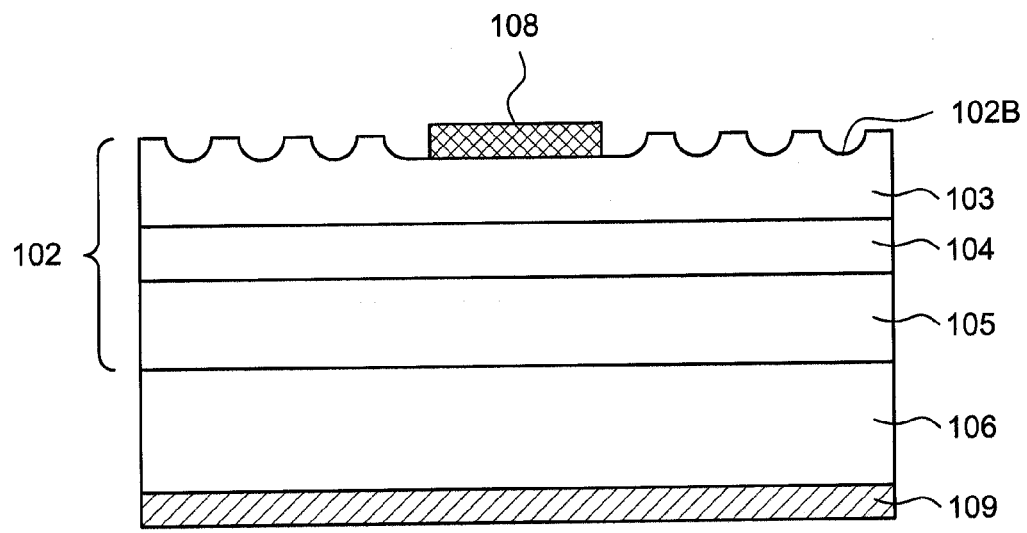
FIG. 6 is a schematic view illustrating the formation of electrodes on the multilayered epitaxy structure of the vertical light-emitting diode.

Lastly referring to FIG. 6, a first electrode 108 is formed on the electrode contact surface 102C by electron-beam evaporation or other suitable metal deposition methods. In addition, a second electrode 109 is formed on a side of the conducting substrate 106 opposite to the side of the multilayered epitaxy structure 102, whereby completing the structure of the vertical type light-emitting diode.

At least one advantage of the method described herein is the ability to define the electrode contact surface directly on the multilayered epitaxy structure. Therefore, no planarized area for the electrode contact is required on the irregular surface of the substrate. Accordingly, the same substrate can be used for different LED structures (e.g., VLED or horizontal LED), and the cost of the substrate can also be reduced.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A method of manufacturing a vertical type light-emitting diode comprising:
    providing a first substrate having an irregular surface;
    forming a multilayered epitaxy structure including a plurality of group III nitride semiconductor compound layers on the irregular surface, wherein the multilayered epitaxy structure has a first surface and a second surface opposite to the first surface, and the first surface is in contact with the irregular surface;
    placing a second substrate on the second surface;
    removing the first substrate to expose the first surface of the multilayered epitaxy structure;
    etching a portion of the first surface to form an electrode contact surface; and
    forming an electrode on the electrode contact surface.

2. The method of claim 1, wherein the multilayered epitaxy structure comprises a n-type gallium nitride (GaN) layer, an emitting layer, and a p-type gallium nitride (GaN) layer.

3. The method of claim 1, wherein the emitting layer is composed of multiple quantum well (MQW).

4. The method of claim 1, wherein the first surface is an irregular surface.

5. The method of claim 1, wherein the electrode contact surface is an even surface.

6. The method of claim 1, wherein the second substrate is a conducting substrate.

7. The method of claim 1, further comprises forming another electrode on the second substrate.

8. The method of claim 1, wherein the step of etching a portion of the first surface comprises:
    forming a photoresist layer on the first surface;
    exposing a portion of the first surface corresponding to an electrode contact region via the photoresist layer; and
    planarizing the portion of the first surface located in the electrode contact region to form the electrode contact surface.

* * * * *